United States Patent [19]
Carson et al.

[11] Patent Number: 5,463,190
[45] Date of Patent: Oct. 31, 1995

[54] ELECTRICALLY CONDUCTIVE ADHESIVE

[75] Inventors: Robert T. Carson, Boynton Beach; Arnold W. Hogrefe, Ft. Lauderdale; Frank J. Juskey, Jr., Coral Springs, all of Fla.

[73] Assignee: Motorola, Inc., Schaumburg, Ill.

[21] Appl. No.: 223,413

[22] Filed: Apr. 4, 1994

[51] Int. Cl.$^6$ ....................................... H05K 1/00
[52] U.S. Cl. .......................... 174/259; 174/257; 174/256; 361/751; 439/66
[58] Field of Search ................................ 174/250, 256, 174/257, 258, 259; 361/751; 228/179, 180.1, 180.2; 439/66

[56] References Cited

U.S. PATENT DOCUMENTS

| | | |
|---|---|---|
| 2,413,579 | 12/1946 | Pennybacker . |
| 3,221,189 | 11/1965 | Brandt et al. . |
| 4,740,657 | 4/1988 | Tsukagoshi et al. . |
| 5,087,494 | 2/1992 | Calhoun et al. . |
| 5,120,665 | 6/1992 | Tsukagoshi et al. . |
| 5,286,417 | 2/1994 | Mahmoud et al. . |

*Primary Examiner*—Kristine L. Kincaid
*Assistant Examiner*—Cheryl R. Figlin
*Attorney, Agent, or Firm*—James A. Lamb

[57] ABSTRACT

A conductive adhesive (120) for electrically and mechanically bonding circuit terminals (105) includes a polymer (121) having a predetermined curing temperature range, a first conductive particulate material (125) suspendable in the polymer (121) for providing substantially uniform conductivity throughout the conductive adhesive (120), and a second conductive particulate material (130) suspendable in the polymer (121) for metallurgically bonding together particles of the first particulate material (125). The first conductive particulate material (125) provides substantially uniform conductivity throughout the conductive adhesive (120) and includes metallic particles having a melting point above the curing temperature of the polymer. The second conductive particulate material (130) welds together particles of the first particulate material (125) and includes metallic particles having a melting point within the curing temperature range of the polymer (121).

21 Claims, 4 Drawing Sheets

ELECTRICALLY CONDUCTIVE ADHESIVE

FIELD OF THE INVENTION

This invention relates in general to adhesives for bonding electronic parts and in particular to conductive polymeric adhesives for bonding electronic parts electrically and mechanically together.

BACKGROUND OF THE INVENTION

There are several known means of connecting circuit terminals which are located on one electronic device to circuit terminals which are located on another electronic device, or to terminals of plated circuits located on substrates, or for attaching connection terminals such as solder leads to circuit terminals such as the plated termination on a crystal blank. The known means include soldering and welding. These means provide a mechanical and electrical bond between the terminals.

Solder is used most prevalently, and is very successfully employed in situations wherein there is sufficient rigidity between the terminals which are metal based and which are electrically and mechanically bonded by the solder itself, as for instance, for small parts soldered to a circuit board. However, there are some instances where such rigidity cannot easily be provided, or in fact, is not desired. One example of such an instance is in the attachment of solder leads to crystal blanks, wherein a compliant attachment is highly desirable to avoid dampening the crystal vibration. There are other instances where soldering to the substrate circuit terminations does not work well. One example of such an instance is the attachment of electronic circuits or conductors (such as flexible circuit conductors) to glass substrates having conductive ceramic surface platings such as Indium-Tin oxide provided thereon, which are unsolderable because solder will not "wet" to the Indium-Tin oxide.

In the two instances mentioned above, crystal lead attachment and glass connections, polymeric conductive adhesives are used with success in some environments. However, problems have been experienced with some electronic devices using available conductive adhesives, such as single component silver filled conductive epoxies. In particular, under temperature and humidity stress, the electrical bonds as well as the mechanical bonds deteriorate, leading to circuit malfunctions. The type of environmental conditions leading to this situation typically exceed the normal office environment, but are typical of the environmental conditions encountered in more rugged applications such as portable paging receivers and portable radio use. Circuit malfunctions of these types are often insidious and usually lead to customer dissatisfaction.

Thus, what is needed is an improved mechanical and electrical bonding material usable for compliant connections and for unsolderable connections.

SUMMARY OF THE INVENTION

Accordingly, in a first aspect of the present invention, a conductive adhesive includes a polymer having a predetermined curing temperature range, a first conductive particulate material suspendable in the polymer for providing substantially uniform conductivity throughout the conductive adhesive, and a second conductive particulate material suspendable in the polymer for metallurgically bonding together particles of the first particulate material.

Accordingly, in a second aspect of the present invention, an electronic device includes a first electronic circuit having one or more circuit terminals, a second electronic circuit having one or more circuit terminals, and a conductive adhesive providing mechanical and electrical bonding between at least one of the circuit terminals of the first electronic circuit to at least one of the connection terminals of the second electronic circuit. The conductive adhesive includes a polymer having a predetermined curing temperature range, a first conductive particulate material suspendable in the polymer and a second conductive particulate material suspendable in the polymer. The first conductive particulate material provides substantially uniform conductivity throughout the conductive adhesive and includes metallic particles having a melting point above the curing temperature of the polymer. The second conductive particulate material welds together particles of the first particulate material and includes metallic particles having a melting point within the curing temperature range of the polymer. Following the curing of the polymer, the metallic particles of the second conductive particulate material are metallurgically bonded to the metallic particles of the first conductive particulate material, to the circuit terminals of the first electronic circuit, and to the connection terminals of the second electronic circuit forming a solid conductive network between the first electronic circuit and the second electronic circuit.

Accordingly, in a third aspect of the present invention, a selective call communication receiver which includes one or more electronic devices for supporting the functions of the selective call communications receiver, includes an electronic circuit having one or more circuit terminals, a substrate having one or more connection terminals for connecting the one or more circuit terminals of the electronic circuit to other of the electronic devices, and a conductive adhesive providing mechanical and electrical bonding between at least one of the circuit terminals of the electronic circuit to at least one of the connection terminals of the substrate. The conductive adhesive includes a polymer having a predetermined curing temperature range, a first conductive particulate material suspendable in the polymer and a second conductive particulate material suspendable in the polymer. The first conductive particulate material provides substantially uniform conductivity throughout the conductive adhesive and includes metallic particles having a melting point above the curing temperature of the polymer. The second conductive particulate material welds together particles of the first particulate material and includes metallic particles having a melting point within the curing temperature range of the polymer. Following the curing of the polymer, the metallic particles of the second conductive particulate material are metallurgically bonded to the metallic particles of the first conductive particulate material, to at least one of the circuit terminals of the electronic circuit, and to at least one of the connection terminals of the substrate forming a substantially solid conductive network between the at least one of the circuit terminals and the at least one of the connection terminals.

DETAILED DESCRIPTION OF THE INVENTION

Figure 1:
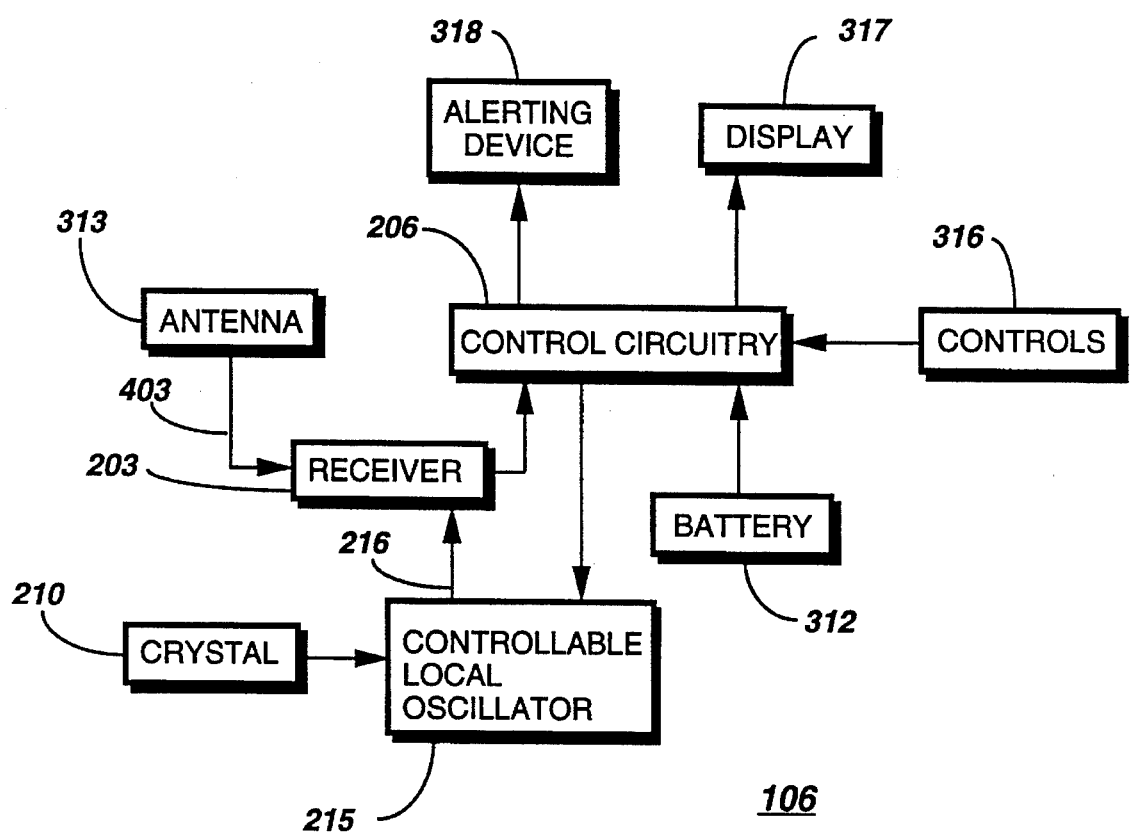
FIG. 1 is an electrical block diagram of a portable receiving device, in accordance with a preferred embodiment of the present invention.

Referring to FIG. 1, an electrical block diagram is shown of a portable receiving device 106 powered by a battery 312, in accordance with a preferred embodiment of the present invention. The portable receiving device 106 operates to intercept a radio signal 403 via an antenna 313. The intercepted radio signal 403 is coupled to a receiver 203, which operates to filter, convert, and demodulate the received signal using conventional techniques. The demodulated signal is coupled from the receiver 203 to a control circuit 206, comprising control logic for decoding and recovering messages contained within the signal, in a manner well known in the art. The control circuit 206 also comprises a frequency selection means which is coupled to a controllable local oscillator 215 for generating a local oscillator signal 216, which is coupled to the receiver 203. The local oscillator signal 216 is used by the receiver 203 for the frequency conversion of the intercepted signal 403. A crystal 210 is coupled to the controllable local oscillator for providing a frequency reference. As determined by the contents of the recovered message and the settings of user controls 316, the control circuit 206 presents at least a portion of the message, using a display 317, such as the liquid crystal display, and also signals the user via a sensible alerting device 318 that a message has been received. The message can include information such as numeric and alphanumeric data messages. The portable receiving device 106 is preferably a paging receiver, such as a FreeSpirit® model paging receiver manufactured by Motorola of Schaumburg, Ill., but may be alternatively be another similar device.

The portable receiving device 106 is representative of many portable devices that include crystals and displays which can benefit from improved conductive adhesive materials. Other such portable devices include portable telephones, portable tape recorders, portable compact disc players, and portable broadcast communication receivers.

Figure 2:
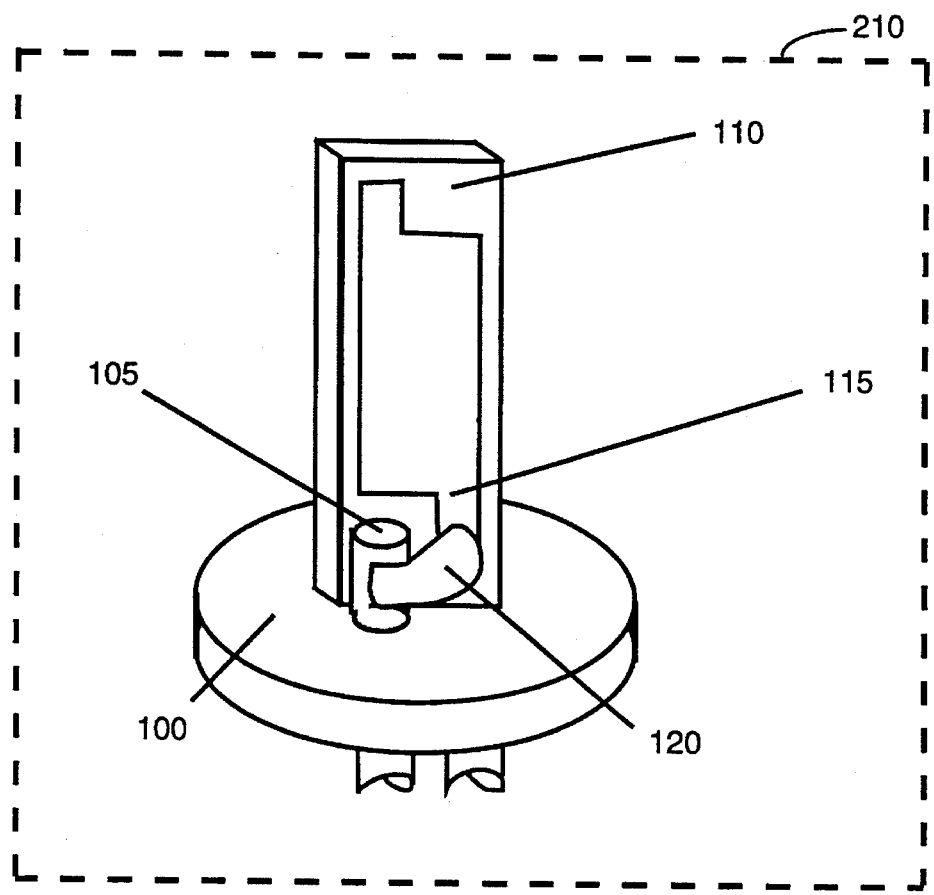
FIG. 2 is a perspective view of a crystal used in the portable receiving device shown in FIG. 1, in accordance with a preferred embodiment of the present invention.
Figure 3:
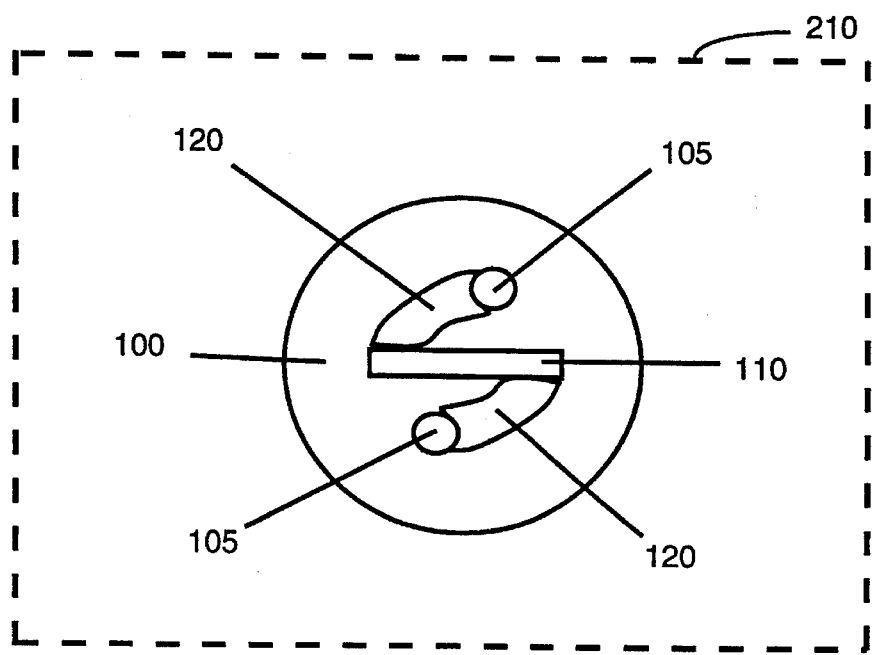
FIG. 3 is a top view of the crystal used in the portable receiving device shown in FIG. 2, in accordance with a preferred embodiment of the present invention.

Referring to FIG. 2 and FIG. 3, a perspective and a top view of the crystal 210 used in the portable receiving device 106 of FIG. 1 are shown, in accordance with a preferred embodiment of the present invention. The crystal 210 includes a quartz crystal blank 110, two gold terminations 115 (only one is visible in FIG. 2) plated onto the crystal blank 110, a crystal base 100 on which the quartz crystal blank 110 is mounted, two solder leads 105 (only one is visible in FIG. 2) embedded in the crystal base 100, and two conductive adhesive connections 120 (only one is visible in FIG. 2). Each conductive adhesive connection 120 provides a compliant mechanical attachment of the quartz crystal blank 110 to the crystal base 100 without impeding oscillation of the quartz crystal blank 110. Each conductive adhesive connection 120 also provides electrical connection between a corresponding one of the gold terminations 115 on the quartz crystal blank 110 and one of the solder leads 105.

Figure 4:
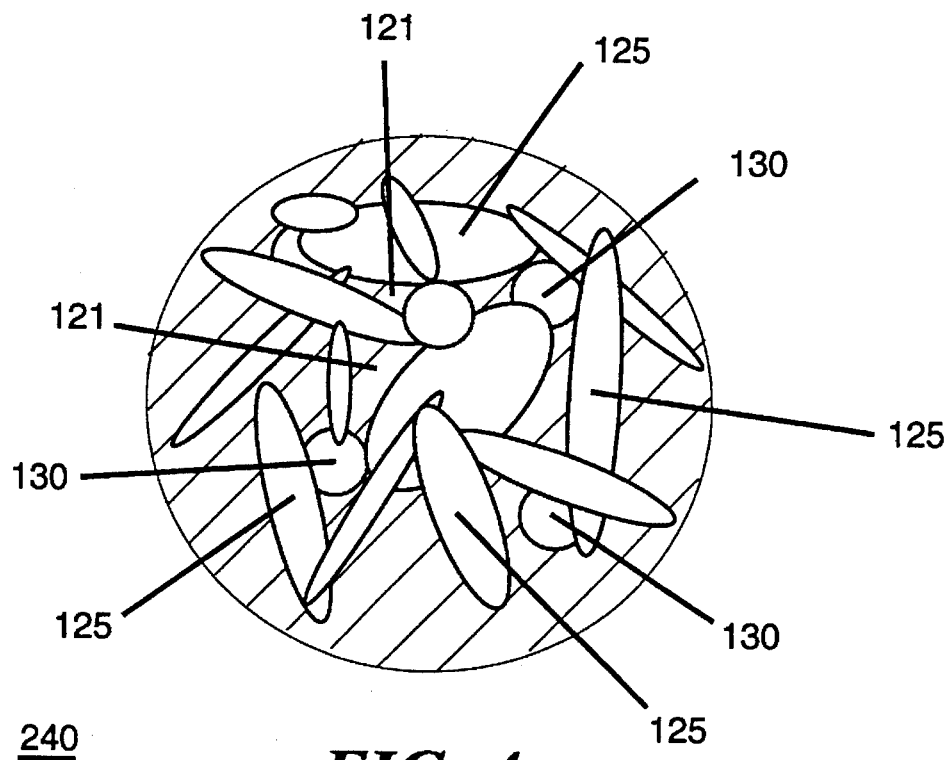
FIG. 4 is a microscopic view of a conductive adhesive for use with the crystal of FIG. 1 and FIG. 2, prior to curing, in accordance with a preferred embodiment of the present invention.

Referring to FIG. 4, a microscopic view of a portion 240 of one of the conductive adhesive connections 120 shown in FIG. 1 and FIG. 2, prior to adhesive curing, in accordance with the preferred embodiment of the present invention. The conductive adhesive connection includes a single component thermosetting polymeric epoxy adhesive 121, a first conductive particulate material which is preferably a silver flake 125, and a second conductive particulate which is preferably an indium powder 130. The polymeric adhesive 121 is preferable an epoxy adhesive having a curing temperature between 100° and 180° C. The silver flake 125, preferably 4–20 μm is diameter, is suspended within the polymeric adhesive during curing by the nature of the flake shape. The indium powder 130, preferably 4–5 μm in diameter, will settle somewhat during curing because of its spherical form, and such setting will cause the indium powder to lodge in the oblique contact points formed between the silver flake 125. The ratio of silver flake 125 to indium powder 130 is preferably 3:1 by volume. This ratio insures the formation of a continuous metallurgically joined structure following curing of the polymeric adhesive 121. The mixture should preferably have a minimum total conductive particulate content of 70% by volume to insure good electrical continuity.

It will be appreciated that the first conductive particles 125 may be monolithic or plated particles. For example, the particles 125 may be polymer spheres having a metal plating surface. It should be further appreciated that the first conductive particles 125 may comprise a mixture of particle types, either monolithic or plated, or both, and wherein one or more types of particles are composed of different metals, the metals having as one selection criteria the achievement of a specific melting temperature or eutectic mixture when combined with the second conductive particles 130. The different metals used for the first conductive particle types 125 may be alloys or pure elements. Metals suitable for use as the first conductive particle types 125 are preferably alloys wherein either Copper, Silver, Platinum, Gold, Aluminum, Nickel, or Palladium is the metal element of largest proportion by weight. It should be further appreciated that the second conductive particles 130 may be monolithic or plated particles. For example, the particles 130 may be polymer spheres having a metal plating. It should be further appreciated that the second conductive particles 130 may comprise a mixture of particle types, either monolithic or plated, or both, wherein one or more particle types are comprised of different metals, the metals having as one selection criteria the achievement of a specific melting temperature or eutectic mixture when combined with the first conductive particles 125. The metals used for the second conductive particles 130 may be alloys or pure elements. Metals suitable for use as second conductive particles 130 are preferably alloys wherein either Tin, Indium, Francium, Cesium, or Bismuth is the metal element of largest proportion by weight. It should also be appreciated that a variety of polymer adhesives exist, such as epoxy (one part B staged or two part thermosetting) and thermoplastic, which may be substituted for the single component thermosetting polymeric adhesive 121.

Figure 5:
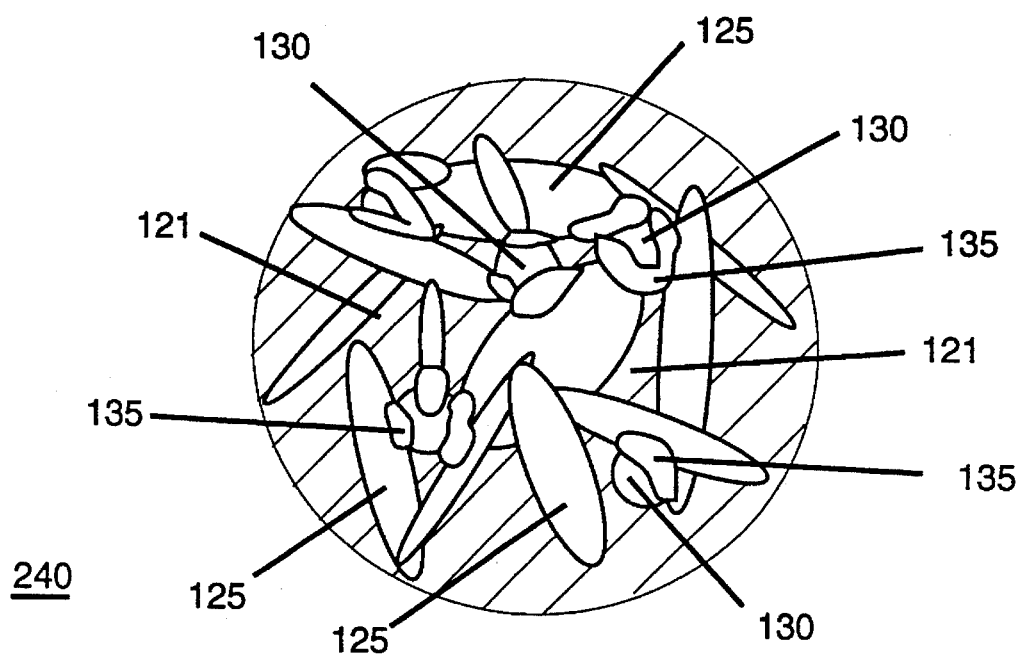
FIG. 5 is a microscopic view of the conductive adhesive for use with the crystal of FIG. 1 and FIG. 2, subsequent to curing, in accordance with a preferred embodiment of the present invention.

Referring to FIG. 5, a microscopic view of the portion 240 of the conductive adhesive shown in FIG. 2, subsequent to polymeric adhesive 121 curing, is shown in accordance with the preferred embodiment of the present invention. A metallurgical bond 135 is formed at points of contact between the silver flake 125 and indium powder 130 at the curing temperature of the conductive adhesive, i.e., 150° C. to 180° C., which is well below the melting point of the silver flake. The metallurgical bond 135, being a physical joining of the silver flake 125 and the indium powder 130 into a solid conductive network, prevents deterioration of the electrical properties of the conductive adhesive 120 under temperature and humidity stress.

Figure 6:
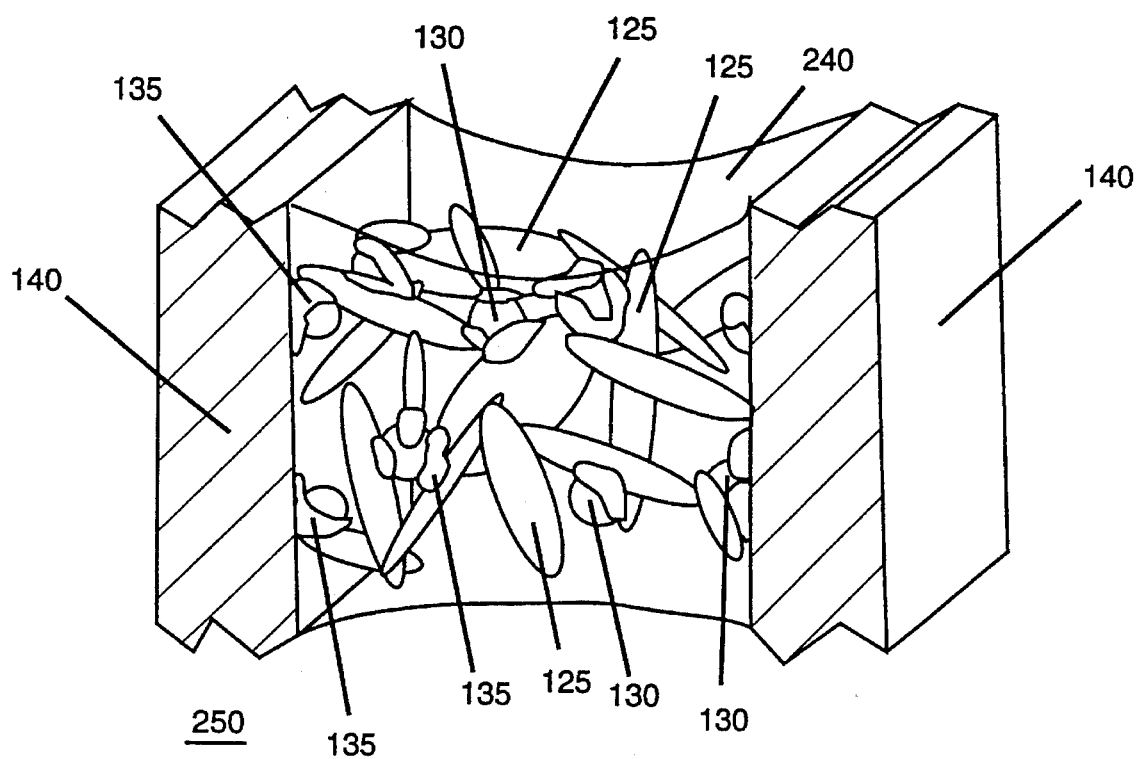
FIG. 6 is a microscopic view of the conductive adhesive showing the metal to metal bonding, subsequent to curing, in accordance with a preferred embodiment of the present invention.

Referring to FIG. 6, a microscopic view of a joint 250 is shown, subsequent to polymeric adhesive 121 curing, in accordance with the preferred embodiment of the present invention. In FIG. 6, a portion of a metallic circuit terminal 140 and a metallic circuit terminal 141 is shown, together with a portion of the solid conductive network 240 comprising the silver flakes 125 joined to the indium powder 130 by the metallurgical bonds 135. Electrical contact between the metallic circuit terminals 140 and 141 and the solid conductive network is facilitated through physical contact between the metallic circuit terminals 140 and 141 and silver flake 125 (or first particulate materials having other content as described above) as well as the metallurgical bond 135 between the metallic circuit terminals 140 and 141 and adjacent indium powder 130 (or second particulate materials of other content as described above). It will be appreciated that an indium-tin oxide circuit termination could be substituted for the metallic circuit terminal 140 when the conductive adhesive 120 is used with a glass substrate and a flexible connector in accordance with an alternative embodiment of the present invention.

By now it should be appreciated that there has been provided a conductive adhesive material which contains two conductive particulate materials. The first conductive particulate material 125 provides electrical conductivity in the conductive adhesive, and does not melt during curing of the polymer. The second conductive particulate material 130 provides electrical conductivity in the conductive adhesive and is selected to melt during curing to form metallurgical bonds between the first conductive particulate material 125, thereby creating a solid conductive network that eliminates resistance rise caused by particle movement of the first conductive particulate material during thermal cycling or corrosion during electrical voltage bias operation in humid environments. The second conductive particulate material 130 also metallurgically joins the first conductive particulate material to metallic circuit terminals as described above, thereby improving the electrical connection thereof.

We claim:

1. A conductive adhesive, comprising:
   a polymer having a predetermined curing temperature range;
   a first conductive particulate material suspendable in said polymer for providing substantially uniform conductivity throughout the conductive adhesive; and
   a second conductive particulate material suspendable in said polymer for metallurgically bonding together particles of said first particulate material;
   wherein said first conductive particulate material comprises a mixture of one or more types of first metallic particles having a melting temperature above the curing temperature of said polymer.

2. The conductive adhesive of claim 1, wherein at least one of said one or more types of first metallic particles are monolithic metal particles.

3. The conductive adhesive of claim 1, wherein at least one of said one or more types of first metallic particles are metal plated particles.

4. The conductive adhesive of claim 1, wherein the metal of at least one of said one or more types of first metallic particles is an alloy in which the metal of largest weight proportion is selected from a group of metals consisting of Copper, Silver, Gold, Platinum, Aluminum, Nickel, and Palladium.

5. The conductive adhesive of claim 1, wherein said second conductive particulate material comprises a mixture of one or more types of second metallic particles having a melting temperature within the curing temperature range of said polymer.

6. The conductive adhesive of claim 5, wherein the melting temperature of said second metallic particles is a eutectic temperature of the combination of said first and second conductive particles.

7. The conductive adhesive of claim 5, wherein at least one of said one or more types of second metallic particles are monolithic metal particles.

8. The conductive adhesive of claim 5, wherein at least one of said one or more types of second metallic particles are metal plated particles.

9. The conductive adhesive of claim 5, wherein the metal of at least one of said one or more types of second metallic particles is an alloy in which the metal of largest weight proportion is selected from a group of metals consisting of Indium, Bismuth, Francium, Cesium, and Tin.

10. An electronic device, comprising:
    first electronic circuit having one or more circuit terminals;
    second electronic circuit having one or more circuit terminals; and
    a conductive adhesive providing mechanical and electrical bonding between at least one of said circuit terminals of said first electronic circuit to at least one of said circuit terminals of said second electronic circuit, wherein said conductive adhesive comprises:
       a polymer having a predetermined curing temperature range;
       a first conductive particulate material suspendable in said polymer for providing substantially uniform conductivity throughout the conductive adhesive, said first conductive particulate material comprising metallic particles having a melting point above the curing temperature of said polymer; and
       a second conductive particulate material suspendable in said polymer for welding together particles of said first particulate material, said second conductive particulate material comprising metallic particles having a melting point within the curing temperature range of said polymer; and
    wherein said metallic particles of said second conductive particulate material are metallurgically bonded to said metallic particles of said first conductive particulate material, to the circuit terminals of said first electronic circuit, and to the circuit terminals of said second electronic circuit following curing of said polymer, forming a substantially solid conductive network between the first electronic circuit and the second electronic circuit.

11. An electronic device according to claim 10, wherein said second electronic circuit comprises:
    a substrate having connection terminals for connecting the one or more circuit terminals of said first electronic circuit to other electronic devices.

12. A selective call communication receiver, comprising:

one or more electronic devices for supporting the functions of the selective call communications receiver, comprising:

an electronic circuit having one or more circuit terminals;

a substrate having one or more connection terminals for connecting said one or more circuit terminals of said electronic circuit to other of said electronic devices; and a conductive adhesive providing mechanical and electrical bonding between said at least one of said circuit terminals of said electronic circuit to at least one of said connection terminals of said substrate, wherein said conductive adhesive comprises:

a polymer having a predetermined curing temperature range;

a first conductive particulate material suspendable in said polymer for providing substantially uniform conductivity throughout the conductive adhesive, said first conductive particulate material comprising metallic particles having a melting point above the curing temperature of said polymer; and a second conductive particulate material suspendable in said polymer for welding together particles of said first particulate material, said second conductive particulate material comprising metallic particles having a melting point within the curing temperature range of said polymer; and wherein said particles of said second conductive particulate material are metallurgically bonded to said particles of said first conductive particulate material, and at least one of said circuit terminals of said electronic circuit, and at least one of said connection terminals of said substrate, following the curing of said polymer thereby forming a solid conductive network between said at least one of said circuit terminals and said at least one of said connection terminals.

13. A conductive adhesive, comprising:

a polymer having a predetermined curing temperature range;

a first conductive particulate material suspendable in said polymer for providing substantially uniform conductivity throughout the conductive adhesive; and a second conductive particulate material suspendable in said polymer for metallurgically bonding together particles of said first particulate material;

wherein said second conductive particulate material comprises a mixture of one or more types of first metallic particles having a melting temperature within the curing temperature range of said polymer.

14. The conductive adhesive of claim 13, wherein said first conductive particulate material comprises a mixture of one or more types of second metallic particles having a melting temperature above the curing temperature of said polymer.

15. The conductive adhesive of claim 14, wherein at least one of said one or more types of second metallic particles are monolithic metal particles.

16. The conductive adhesive of claim 14, wherein at least one of said one or more types of second metallic particles are metal plated particles.

17. The conductive adhesive of claim 14, wherein the metal of at least one of said one or more types of second metallic particles is an alloy in which the metal of largest weight proportion is selected from a group of metals consisting of Copper, Silver, Gold, Platinum, Aluminum, Nickel, and Palladium.

18. The conductive adhesive of claim 13, wherein the melting temperature of said first metallic particles is a eutectic temperature of the combination of said first and second conductive particles.

19. The conductive adhesive of claim 13, wherein at least one of said one or more types of first metallic particles are monolithic metal particles.

20. The conductive adhesive of claim 13, wherein at least one of said one or more types of first metallic particles are metal plated particles.

21. The conductive adhesive of claim 13, wherein the metal of at least one of said one or more types of first metallic particles is an alloy in which the metal of largest weight proportion is selected from a group of metals consisting of Indium, Bismuth, Francium, Cesium, and Tin.

* * * * *